United States Patent [19]

Hampshire

[11] 4,441,136
[45] Apr. 3, 1984

[54] SWITCHING CIRCUIT

[75] Inventor: Michael J. Hampshire, Liversedge, England

[73] Assignee: Salplex Limited, London, England

[21] Appl. No.: 384,943

[22] Filed: Jun. 4, 1982

Related U.S. Application Data

[63] Continuation of Ser. No. 85,289, Oct. 16, 1979, abandoned.

[30] Foreign Application Priority Data

Oct. 21, 1978 [GB] United Kingdom ............... 41475/78

[51] Int. Cl.³ ............................................ H02H 7/20
[52] U.S. Cl. ........................................ 361/88; 361/86; 361/93; 361/91; 307/464; 307/471; 307/445
[58] Field of Search ...................... 361/88, 89, 86, 93, 361/94, 98, 91, 90; 307/207 P, 298, 303, 304, 125; 324/158 T; 431/24, 26

[56] References Cited

U.S. PATENT DOCUMENTS

| | | | |
|---|---|---|---|
| 3,589,282 | 6/1971 | King | 361/98 X |
| 3,663,958 | 5/1972 | Crane | 361/86 X |
| 3,906,258 | 9/1975 | Moe . | |
| 3,944,889 | 3/1976 | Conway | 361/89 |
| 3,950,656 | 4/1976 | Sumida et al. . | |
| 4,016,459 | 4/1977 | Boehringer | 361/88 |
| 4,021,701 | 5/1977 | Davies | 330/207 P X |
| 4,024,437 | 5/1977 | Suzuki | 361/70 |
| 4,127,887 | 11/1978 | Tanaka et al. | 361/88 X |
| 4,150,413 | 11/1979 | Nerem | 361/86 |
| 4,178,620 | 12/1979 | Yu | 361/86 X |

Primary Examiner—Patrick R. Salce
Attorney, Agent, or Firm—Fleit, Jacobson, Cohn & Price

[57] ABSTRACT

A switching circuit has a solid state power switch (9) which is either a PNP or NPN transistor or a VMOS p- or n-channel device. Three individual sensing circuits (2, 3, 4) are set to indicate whether a predetermined operating characteristic of the switch (9) is greater or less than a given threshold value and thus to indicate if a fault is present in the switch (9) or the load (L) it supplies. Digital logic circuit means comprising three logic circuits (5, 6, 8) produce two digital signals from the output signals of the sensing circuits respectively indicating if a fault exists and if it is a serious fault or not. A circuit (7) comprising gating means disables the switch (9) in the event of a serious fault and a delay circuit (33, 34) is provided associated with the logic circuit means to prevent current surges due to short circuit faults being confused with normal operating current surges in switch on.

10 Claims, 1 Drawing Figure

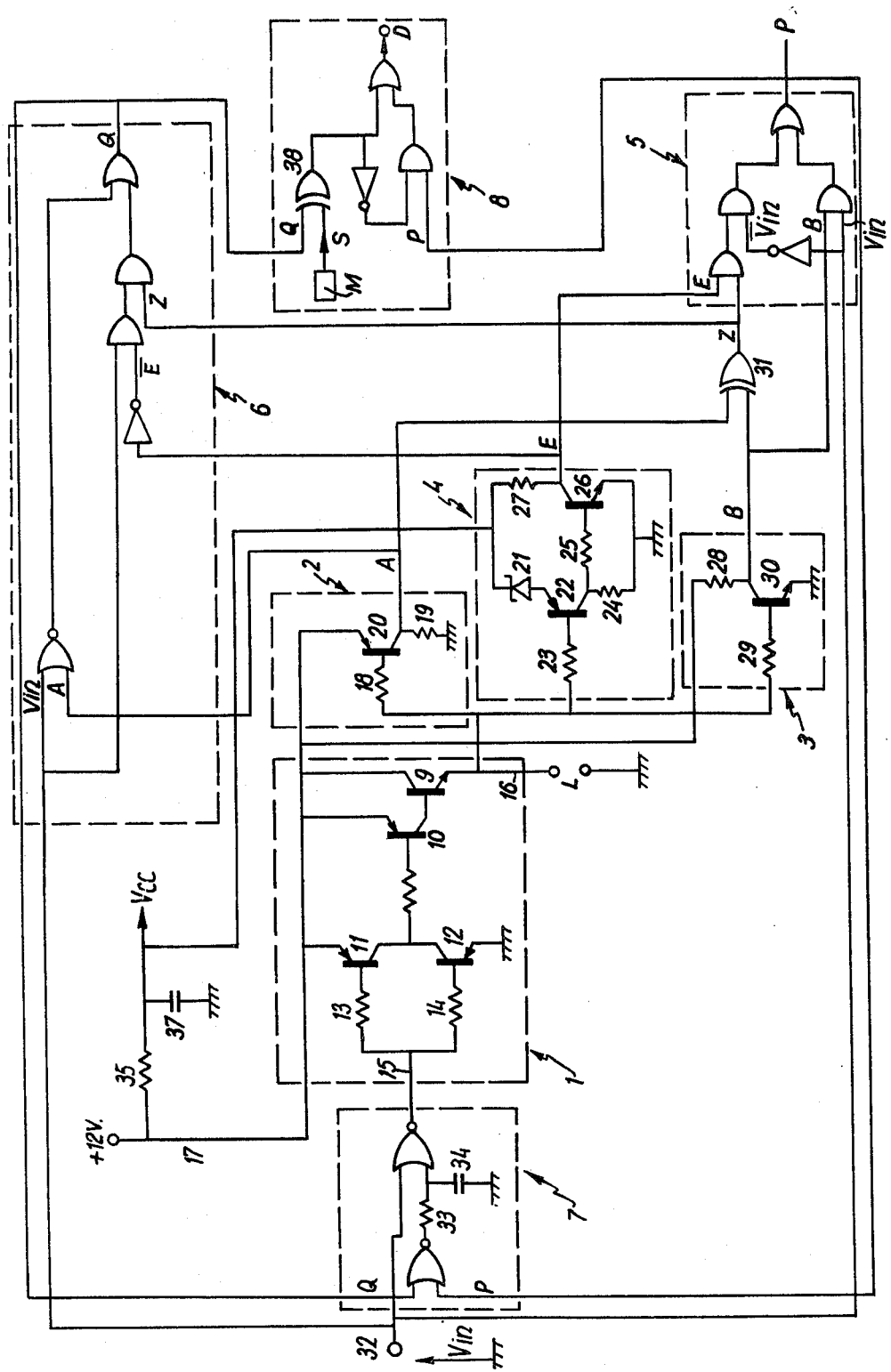

SWITCHING CIRCUIT

This is a continuation of application Ser. No. 85,289 filed Oct. 16, 1979; now abandoned.

This invention relates to the provision of electronic switching circuitry which contains means to switch power to loads.

In the event of a fault, either in the switch itself or in the load, the current through the switch will be greater than it should be. This change in the current operating characteristic of the switch can be monitored and used to indicate that a fault is present and that corrective action needs to be taken. Corrective action then taken can avoid further damage to the switch, and perhaps more important to the load itself.

According to the present invention, there is provided a switching circuit comprising a solid state switch, drive circuitry for driving the switch and sensing circuitry for sensing an operating characteristic of the switch and for producing a control signal independence upon the characteristic sensed.

A preferred embodiment of the invention may comprise any of the following advantages and features:

(a) The solid state switch in a PNP or NPN transistor.

(b) The solid state switch is a p-channel or n-channel vertical metal oxide semiconductor device (VMOS).

(c) The operating characteristic of the switch which is sensed when the switch is a transistor is the saturation level of the emitter-collector voltage.

(d) The operating characteristic of the switch which is sensed when the switch is a VMOS device is the saturation level of the source-drain voltage.

(e) The sensing circuitry comprises one or more individual circuits, the circuit or each circuit being respectively set to indicate whether the operating characteristic of the switch sensed is greater or less than a given threshold value for that circuit and to produce an digital out-put signal accordingly.

(f) Digital logic circuit means are provided operative to produce two digital output signals from one or more individual output signals of the individual circuits of (e), one of the two signals indicating whether a fault in the switch or a load, which in operation of the circuit is fed from the switch, is present or not and the other signal indicating whether that fault is serious or not.

(g) Logic circuitry is provided to disable the switch if a serious fault exists.

(h) The logic circuitry of (g) contains means by which the application of a disabling signal is delayed so that a short-lived fault situation such as the initial surge of current into a tungsten filament bulb, which closely resembles a short circuit load, does not disable the switch.

(i) The or any part of the circuitry may be in the form of an integrated circuit.

In a preferred embodiment of the invention employing a bipolar power transistor as a switch applying a load, the status of the power switch and the current in the load is sensed by the magnitude of the emitter-collector voltage in saturation (VECSAT). The sensing circuitry comprises three individual sensing circuits. If the current in the load is zero, then VECSAT is also approximately zero. If the normal current flows in the load then VECSAT is usually between 0.8 and 1.5 volts. If the load is short circuited, then VECSAT is obviously equal to the full rail voltage. If a partial short circuit load condition arises, or alternatively if the power transistor is faulty, an abnormally high VECSAT, say greater than three volts, will occur.

The output of each of the three circuits of the sensing circuitry is either 0 or 1 depending upon whether VECSAT is greater or less than a given threshold voltage which is set at different values in each of the three circuits. The threshold value of the first circuit is set at 0.7 volts, the threshold value of the second value of VECSAT, which will depend on the characteristic of the power transistor and the size of the load. The third circuit has a threshold value at the rail voltage less 0.7 volts. The three circuits are conceived in such a way that a current is supplied to the load when the power supply is off, and different combinations of the three digital logic output levels of the three conduits occur if faults in the switch or in the load, or a normal condition, are present.

The invention also comprises a vehicle comprising circuitry as defined above.

In order that the invention may be more clearly understood, one embodiment thereof will now be described, by way of example, with reference to the accompanying drawing, which shows a circuit diagram of an electronic power switch with diagnostics for a vehicle.

Referring to the drawing, a circuit 1 comprises an input 15, output 16, two resistors 13 and 14, two transistors 11 and 12 and power transistor means (9, 10) connected to perform the function of a power switch. Current is supplied to a load L from the output 16 through ground, when the input 15 is high. If the input 15 is low then the power transistor 9 is off and cannot supply current to the load. Transistor 10 serves merely to provide sufficient base current to drive the power transistor 9, and transistor 12 similarly provides base current to drive the transistor 10. The presence of transistor 11 is to provide the load for transistor 12. The current consumed by the switch, when off, is limited by the value of resistor 13 which can have a high value. If a typical power transistor such as TIP 3055 is used for transistor 9, the value of VECSAT depends on the load resistor and hence the load current as shown in the following table 1.

TABLE 1

| Load Resistance | Load Current | VECSAT(12V rail) |
|---|---|---|
| 3.14Ω | 3.5A | 1V |
| 6.6Ω | 1.7A | .8V |
| 28.2Ω | .4A | .7V |
| 11.5KΩ | 1mA | .5V |
| 47K | .25mA | .45V |
| ∞ | 0 | 0 |

A further circuit 2 contains a resistor 18 and a transistor 20 connected such that a digital output level at output A is high (logic 1) if the input which is connected to the emitter of the power transistor 9 (terminal 16) is within 0.7 V approximately of the positive power rail 17. Transistor 20 is therefore used as a switch with a threshold of 0.7 V. A circuit 4 similarly provides a digital logic output at E dependent upon the voltage at the input which is connected to the emitter of the power transistor 9. This circuit 4 comprises two transistors 22 and 26, a resistor 23 connected to the transistor 22 base, a resistor 24 connected to the transistor 22 collector, a zener diode 21 connected to the transistor 22 emitter, a resistor 25 connecting the collector of transistor 22 and base of transistor 26, and a resistor 27 connected to the collector of transistor 26. The threshold value for the input to circuit 4 is dependent upon the zener voltage of diode 21 summed with the threshold of transistor 22 which is approximately 0.7 V. Transistor 26 simply provides an appropriate logic level for the output E at 12 V when high, and approximately zero volts when low. A suitable value for the zener voltage of diode 21 would be 4.7 V, in which case the output E would be high if VECSAT was less than 5.4 V; alternately, the output E would be low if VECSAT was greater than 5.4 V. A circuit 3 is simply the complement of circuit 2, and a high digital output is obtained at output B of circuit 3 if VECSAT rises to within 0.7 V of the rail voltage; alternately, a low state for output B is obtained. Circuit 3 comprises a transistor 30 having a base resistor 29 and collector resistor 28. The inputs to the three circuits 2, 3 and 4 are all connected together with the following result. If the power transistor 9 is off and the load is connected, then resistors 18 and 23 feed current through the load enabling its continuity to be tested. If the load is an open circuit and transistor 9 is off then transistors 20 and 30 are biased on. The value of resistors 29, 23 and 18 are chosen so that, in this condition, transistor 22 is also biased on.

The two inputs of an exclusive OR gate 31 are respectively connected to outputs A and B and produce from the signals presented at its inputs a digital output signal Z.

There are three logic circuits 5, 6 and 8. The logic circuit 5 has digital inputs E, Z, $V_{in}$ and B and produces a logic output P which can be expressed Boolean algebra as P = B when $V_{in}$ = 1 (the off condition of switch) or
P = Z.E when $V_{in}$ = (the on condition of switch)

If P is low there is a fault condition, otherwise P is high.

The logic circuit 6 has digital inputs A, E, Z and $V_{in}$ and produces a logic output Q. This can be expressed as Q = Z.$\bar{E}$ when $V_{in}$ = 1 (the off condition of switch) or
Q = $\bar{A}$ when $V_{in}$ = 0 (the on condition of switch)

Providing a fault exists, Q is low for serious faults, otherwise it is high. If P is high indicating a no fault condition, then Q is low, but at any rate the value of Q is irrelevant if no fault exists. The following table 2 expresses the relationship between all the digital signals appropriate to the condition of the load and power transistor 9.

TABLE 2

| CONDITION | $V_{in}$ = 1 - SWITCH IS IN OFF STATE | | | | | |
|---|---|---|---|---|---|---|
| | VOLTAGE AT TERMINAL 16 | E | A | B | Z | P = B | Q = Z.$\bar{E}$ |
| Normal No Fault | 0 | 0 | 1 | 1 | 0 | 1 | 0 |
| Open Circuit Load | Less than (rail −5.4V) Greater than 0.7V | 0 | 1 | 0 | 1 | 0 | 1 |
| Perfect short circuit in power transistor 9 | rail | 1 | 0 | 0 | 0 | 0 | 0 |
| Partial short circuit in power transistor 9 | Greater than (rail −5.4V) | 1 | 1 | 0 | 1 | 0 | 0 |
| Short circuit load | | CANNOT BE IDENTIFIED IN THE OFF STATE | | | | | |
| Open circuit in power transistor 9 | | | | | | | |

TABLE 2-continued

| CONDITION | $V_{in}$ = 0 - SWITCH IS IN ON STATE | | | | | |
|---|---|---|---|---|---|---|
| | VOLTAGE AT TERMINAL 16 | E | A | B | Z | P = Z.E | Q = $\bar{A}$ |
| Norman No Fault | Less than (rail −0.7V) greater than (rail −5.4V) | 1 | 1 | 0 | 1 | 1 | 0 |
| Open circuit load | rail | 1 | 0 | 0 | 0 | 0 | 1 |
| Perfect short circuit load | 0 | 0 | 1 | 1 | 0 | 0 | 0 |
| Partial short circuit load | Less than (rail −5.4V) Greater than 0.7V | 0 | 1 | 0 | 1 | 0 | 0 |
| High resistance in power transistor 9 | Less than (rail −5.4V) Greater than 0.7V | 0 | 1 | 0 | 1 | 0 | 0 |
| Perfect short in power transistor 9 | rail | 1 | 0 | 0 | 0 | 0 | 1 |
| Partial short in power transistor 9 | CANNOT BE IDENTIFIED IN THE ON STATE | | | | | | |

Circuit 7 contains gating means to disable the switch by isolating input 15 to the switch circuit 1 from $V_{in}$, which is applied at terminal 32, providing both P and Q are low together indicating a serious fault is present. This obviates the normal requirements to fuse the switch. For any other condition of P together with Q, the inverse of $V_{in}$ appears at terminal 15. A time constant made up of resistor 33 and capacitor 34 is inserted in order that the disabling signal is delayed. This is done so that initial surges of current when filament bulbs, for example, are first switched on, do not cause the switch circuit 1 to be turned off. The initial surge of current into the tungsten filament bulb may constitute a short circuit load condition for a short period of time which may be typical of the order of 30 ms for a 22 W bulb. The time constant obtained by the product of resistor 33 and capacitor 34 must therefore exist to enable the initial surge of current to occur.

A low pass filter circuit comprising a resistor 35 and capacitor 37 is included in order that high frequency variations of the positive power rail 17 are not transmitted to the positive terminal $V_{cc}$, of all the logic gates. The transistors 22 and 26 are also fed from the low pass filter comprising resistor 35 and capacitor 37. This filter prevents the system from oscillating when a short circuit load condition arises. If a filter were not present then on the occurrence of a short circuit load the value of the voltage on the positive rail 17 may fall to such a low value, that the switch is disabled and the logic circuits do not function correctly such that the entire system can oscillate without the switch 1 being disabled by the circuit 7.

Logic circuit 8 is supplied with logic inputs Q and P together with a square wave signal S from source M which alternately provides a logic 1 followed by a logic 0 sequentially in time. The logic output produced by the circuit at D provides information as to the presence of a fault when taken in association with S which is compared with Q by an exclusive OR gate 38. Signals S and D are, therefore appropriate signals for the sequential transmission of information regarding the presence or not of a fault and the type of fault if appropriate, by a multiplex transmission system such as is described in our copending United Kingdom application No. 9493/78. The logic can be stated as follows; if S=Q then set D=P, if S≠Q then set D=1. The truth table applicable to the logic produced by circuit 8 is set out in table 3 below.

TABLE 3

|  | Q | P | D | S |
|---|---|---|---|---|
| Serious fault present | 0 | 0 | 0 | 0 |
| Serious fault not present | 0 | 1 | 1 | 0 |
| Non-serious fault present | 1 | 0 | 1 | 0 |
| Non-serious fault not present | 1 | 1 | 1 | 0 |
| Serious fault present | 0 | 0 | 1 | 1 |
| Serious fault not present | 0 | 1 | 1 | 1 |
| Non-serious fault present | 1 | 0 | 0 | 1 |
| Non-serious fault not present | 1 | 1 | 1 | 1 |

It will be appreciated that the above embodiment has been described by way of example only and that many variations are possible without departing from the scope of the invention. For example, instead of three sensing circuits being provided, only one sensing circuit could be employed, that circuit being used to determine simply whether the load voltage was high or low. Further, instead of delaying acting upon a fault signal produced during initial switch on condition of a filament bulb, the fault signal can be accepted immediately but action normally consequent upon it to switch off the bulb will be delayed.

What is claimed is:

1. A switching circuit comprising a solid state switch having an input and output, a load connected to the output of the solid state switch, switch sensing circuitry means connected to the load for indicating current therein, drive circuitry means for driving the solid state switch which, in turn activates, the switch sensing circuitry means so that the switch sensing circuitry means senses an operating characteristic of the solid state switch, said switch sensing circuitry means comprising at least three individual circuits, said at least three individual circuits being connected to the load for measuring the the voltage across the solid state switch and issuing signals indicating whether operating values of said at least three individual circuits are greater or less than given threshold values for said at least three individual circuits, and digital logic circuit means connected to said at least three individual circuits for receiving said signals issued by said at least three individual circuits and for producing two digital output signals from the signals received from said at least three individual circuits, one of said two signals indicating whether or not a fault in the solid state switch or in the load is present, and another of said two signals indicating the seriousness of said fault.

2. A switching circuit as claimed in claim 1, wherein the solid state switch comprises one of a PNP or an NPN transistor having a saturation emitter-collector voltage, and wherein the switch sensing circuitry means is connected to the solid state switch to sense the saturation emitter-collector voltage.

3. A switching circuit as claimed in claim 1, wherein the solid state switch comprises one of a p-channel or an n-channel vertical metal oxide semiconductor device (VMOS) having a saturation source-drain voltage, and wherein the switch sensing circuitry means is connected to the solid state switch to sense the saturation source-drain voltage.

4. A switching circuit as claimed in claim 1, further comprising logic circuitry means connected to said drive circuitry means for disabling the solid state switch if a serious fault exists.

5. A switching circuit as claimed in claim 4, said logic circuitry means generating a disabling signal and comprising a delay circuit for delaying the generation of the disabling signal.

6. A switching circuit, comprising:
a solid state switch having an input and an output;
input means for receiving an input voltage V, and connected to the input of said solid state switch for providing said input voltage V thereto, said input voltage V having two conditions indicating that said solid state switch is on and off, respectively;
a load connected to the output of the solid state switch;
switch sensing circuitry means connected to the load for indicating current therein, and connected to the solid state switch for sensing an operating characteristic of the solid state switch, and producing an output A, B and E; and
logic circuit means connected to said switch sensing circuitry means, and responsive to said output thereof, for issuing an output signal P indicating whether or not a fault in the solid state switch or in the load is present;
wherein said logic circuit means comprises an AND gate for performing an AND operation with respect to said input voltage V and said output B to provide an AND gate output having two states, one of said two states indicating presence of a fault, an exclusive-OR gate for performing an exclusive-OR operation with respect to said outputs A and B to obtain an output Z, an inverter for receiving and inverting said input voltage to obtain an output VNOT, at least one AND gate for performing an AND operation with respect to said outputs E, Z and VNOT to obtain a further AND gate output having two states, one of said states indicating presence of a fault.

7. The switching circuit of claim 6, wherein said logic circuit means issues an output signal Q indicating the seriousness of the fault, said logic circuit means further comprising a source for issuing a square wave output signal S, an exclusive-OR gate for performing an exclusive-OR operation with respect to said output signals Q and S to obtain an exclusive-OR gate output signal, an inverter connected to the exclusive-OR gate for inverting the exclusive-OR output signal to obtain an inverted exclusive-OR gate output signal, an AND gate for performing an AND operation with respect to said inverted exclusive-OR gate output signal and said output signal P to obtain an additional AND gate output signal, and an OR gate for performing an OR gate operation with respect to said exclusive-OR gate output signal and said additional AND gate output signal to obtain a further output signal D further indicating the seriousness of said fault.

8. A switching circuit, comprising:
a solid state switch having an input and output;
input means for receiving an input voltage V, and connected to the input of said solid state switch for providing said input voltage V thereto, said input voltage V having two conditions indicating that said solid state switch is on and off, respectively;
a load connected to the output of the solid state switch;
switch sensing circuitry means connected to the load for indicating current therein, and connected to the solid state switch for sensing an operating characteristic of the solid state switch, and producing an output A; and logic circuit means connected to said switch sensing circuitry means, and responsive to said output thereof for issuing an output signal Q indicating the seriousness of a fault when a fault is present; wherein said logic circuit means comprises a NOR gate for performing a NOR operation with respect to said input voltage V and said output A to provide a NOR output having two states, one of said two states indicating a serious fault.

9. The switching circuit of claim 8, wherein said switch sensing circuitry means produces further outputs B and E, and wherein said logic circuit means issues an output signal P indicating whether or not a fault in the solid state switch or in the load is present, said logic circuit means further comprising an exclusive-OR gate for performing an exclusive-OR operation with respect to said outputs A and B to derive an output Z, said logic circuit means further comprising an inverter connected to said switch sensing circuitry means for inverting the output E to obtain an inverted output ENOT, an AND gate for performing an AND operation with respect to said input voltage V and said output ENOT to obtain a further AND gate output, and an additional AND gate for performing an AND operation with respect to said further AND gate output and said output Z to obtain a still further AND gate output having two states, one of said two states indicating the seriousness of a fault when a fault exists.

10. The switching circuit of claim 8, wherein said logic circuit means issues an output signal Q indicating the seriousness of the fault, said logic circuit means further comprising a source for issuing a square wave output signal S, an exclusive-OR gate for performing an exclusive-OR operation with respect to said output signals Q and S to obtain an exclusive-OR gate output signal, an inverter connected to the exclusive-OR gate for inverting the exclusive-OR gate output signal to obtain an inverted exclusive-OR gate output signal, an AND gate for performing an AND operation with respect to said inverted exclusive-OR gate output signal and said output signal P to obtain an additional AND gate output signal, and an OR gate for performing an OR gate operation with respect to said exclusive-OR gate output signal and said additional AND gate output signal to obtain a further output signal D further indicating the seriousness of said fault.

* * * * *